(12) United States Patent
McCartney et al.

(10) Patent No.: US 6,323,801 B1
(45) Date of Patent: Nov. 27, 2001

(54) BANDGAP REFERENCE CIRCUIT FOR CHARGE BALANCE CIRCUITS

(75) Inventors: Damien McCartney; John O'Dowd; Niall McGuinness, all of Limerick; John Keane, Dublin, all of (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 09/348,951

(22) Filed: Jul. 7, 1999

(51) Int. Cl.$^7$ .................................................. H03M 1/12
(52) U.S. Cl. ...................... 341/172; 307/296.6; 341/143
(58) Field of Search .................................... 341/172, 143; 307/296.6, 296.8

(56) References Cited

U.S. PATENT DOCUMENTS

| | | | |
|---|---|---|---|
| 4,375,595 | 3/1983 | Ulmer et al. | 307/297 |
| 5,039,989 | 8/1991 | Welland et al. | 341/143 |
| 5,059,820 | 10/1991 | Westwick | 307/296.6 |
| 5,134,401 | 7/1992 | McCartney et al. | 341/143 |
| 5,352,972 | 10/1994 | Pernici et al. | 323/313 |
| 5,479,130 | 12/1995 | McCartney | 327/341 |
| 5,563,504 | 10/1996 | Gilbert et al. | 323/316 |
| 5,675,334 | 10/1997 | McCartney | 341/118 |
| 5,867,012 | 2/1999 | Tuthill | 323/313 |
| 5,900,772 | * 5/1999 | Somerville et al. | 327/539 |

FOREIGN PATENT DOCUMENTS

| | | |
|---|---|---|
| 08803752 | * 9/1989 | (FR) . |
| 11219223-A | * 2/1998 | (JP) . |

OTHER PUBLICATIONS

Brokaw, "A Simple Three–Terminal IC Bandgap Reference", IEEE Journal of Solid–State Circuits, vol. SC–9, No. 6, pp. 388–393, Dec. 1974.

Michejda et al., "A Precision CMOS Bandgap Reference", IEEE Journal of Solid–State Circuits, vol. SC–19, No. 6, pp. 1014–1021, Dec. 1984.

Klaassen, "Digitally Controlled Absolute Voltage Division", IEEE Transactions On Instrumentation And Measurement, vol. 24, No. 2, pp. 106–112, Jun. 1975.

* cited by examiner

Primary Examiner—Peguy JeanPierre
Assistant Examiner—Jean Bruher Jeanglaude
(74) Attorney, Agent, or Firm—Samuels, Gauthier & Stevens, LLP

(57) ABSTRACT

A method and circuit for providing a reference voltage to a charge balance circuit. The method includes transferring charge corresponding to $V_{BE}$ and charge corresponding to $\Delta V_{BE}$ to a summing node of the charge balance circuit, where $V_{BE}$ is a voltage produced across a p-n junction and where $\Delta V_{BE}$ is a difference between two $V_{BE}$ voltages. With such method, instead of forming a bandgap reference circuit which produces a bandgap reference voltage and applying such voltage to the reference sampling and charge transfer circuit, charge corresponding to $V_{BE}$ and charge corresponding to $\Delta V_{BE}$ are transferred to the input summing node of the modulator in correct proportion and with a polarity corresponding to the modulator output. Thus, the reference sampling and charge transfer circuit delivers $V_{BE}$ and $\Delta V_{BE}$ charge samples to the summing node having the correct proportion and polarity, that in aggregate over a modulator cycle, equal the charge that sampling the reference voltage $V_{REF}$ produced by the explicit bandgap reference circuits would deliver.

24 Claims, 10 Drawing Sheets

BANDGAP REFERENCE CIRCUIT FOR CHARGE BALANCE CIRCUITS

BACKGROUND OF THE INVENTION

This invention relates generally to bandgap reference circuits and more particularly to bandgap reference circuits adapted for use in charge balance circuits.

As is known in the art, bandgap reference circuits have widespread use in integrated circuits to provide a reference voltage which is substantially invariant with temperature. The original integrated circuit bandgap reference circuit used bipolar transistors. One such circuit is described in "A Simple Three-Terminal IC Bandgap Reference", by A. P. Brokow, published in IEEE Journal of Solid-State Circuits, vol. SC-9, pp. 388–393, December 1974.

More recently, CMOS technology has been in use for digital circuits and such CMOS circuits frequently require a CMOS bandgap reference circuit. One example of such a circuit is presented in a paper entitled "A Precision CMOS Bandgap Reference", by J. Michejda and S. K. Kim, published in IEEE Journal of Solid-State Circuits, vol. SC-19, no. 6, pp. 1014–1021, December 1984. Such circuit is shown in FIG. 1 and includes a pair of diode-connected bipolar transistors Q1 and Q2, the transistor Q1 having N times the number of emitters of (i.e., N times the emitter area of) transistor Q2, where N is an integer greater than 1. It is noted that a diode-connected transistor provides a p-n junction between the emitter and base terminals thereof, with the collector terminal shorted to the base. These transistors Q1 and Q2 are provided by the substrate bipolar transistor (in this case, p-n-p) that are a by-product of the CMOS process. They are not generally of the same quality as the transistors available in a true bipolar or biCMOS process. In particular, the current gain, beta, and Early voltage, $V_A$, are poorer. The basic idea is to produce a base-emitter voltage $V_{BE}$ and have added to it a multiple G of a voltage $\Delta V_{BE}$ such that the sum, $V_{BE}+G\Delta V_{BE}$, is a reference voltage which is substantially invariant with temperature.

More particularly, an operational amplifier A1 is provided with a resistor $R_2$ connected between the output of amplifier A1 and the inverting (−) input of the amplifier. The inverting input (−) is coupled to ground through a resistor $R_1$ and the diode-connected transistor Q1. The non-inverting input (+) of amplifier A1 is connected to ground through the diode-connected transistor Q2 and to the output of amplifier A1 through the resistor R3. The feedback arranged amplifier A1 drives the junction between resistors $R_1$ and $R_2$ to the same voltage as the voltage at the emitter of transistor Q2. With $R_2=R_3$, the current through the diode-connected transistor Q1 will be driven to the same value as the current through the diode-connected transistor Q2. However, because of the larger emitter area of transistor Q1, transistor Q1 will have a smaller $V_{BE}$ than that of transistor Q2. Thus, $\Delta V_{BE}$, appears across resistor $R_1$ and the output voltage $V_{REF}$ of the amplifier may be expressed as:

$$V_{REF}=V_{BE}+(1+R_2/R_1)\Delta V_{BE}=V_{BE}+G\Delta V_{BE}$$

where $\Delta V_{BE}=V_T \ln(N)=(kT/q)\ln(N)$, k is Boltzman's constant, T is temperature in degrees Kelvin and q is the charge of an electron.

Typically, at 300° K., $V_{BE}$ has a value of about 650 mV and a temperature coefficient of −2 mV/° K. $V_T$ has a value of 25.9 mV and a temperature coefficient of +86.2 µpV/° K. For a typical value N of 8, $\Delta V_{BE}$ will therefore have a value of 53.8 mV and a temperature coefficient of +179.2 µV/° C.

To balance the large negative temperature coefficient of $V_{BE}$, G should be 11.2. That is, $R_2/R_1=10.2$. In such case, $V_{REF}= 0.65+\{11.2\times0.0538\}=1.25$ V.

The main limitation to performance achievable by CMOS bandgap circuits is not the substrate bipolars but the poor offset and low frequency noise (1/f) of the CMOS amplifier, A1. The noise and offset are represented by the voltage source $V_{OS}$ in FIG. 1. The noise and offset add directly to $\Delta V_{BE}$ and therefore see the same high gain G, here 11.2 to the output $V_{REF}$. Thus, the $V_{REF}$, including the effect of noise and offset, (i.e., $V_{OS}$) may be represented as:

$$V_{REF}=V_{BE}+[1+(R_2/R_1)][\Delta V_{BE}+V_{OS}].$$

Another approach to bandgap reference design is the use of a switched capacitor amplifier as shown in FIG. 2 and discussed in U.S. Pat. No. 5,059,820, issued Oct. 22, 1991, entitled "Switched Capacitor Bandgap Reference Circuit Having Time Multiplexed Bipolar Transistor", inventor A. L. Westwick. Here, the basic idea is that $V_{BE}$ and $\Delta V_{BE}$ voltages are sampled on capacitors C1 and C2, respectively, and combined in the correct proportion to form a substantially temperature invariant reference voltage $V_{REF}$. More particularly, a pair of current sources 12, 14 are connected to inputs of switches S1 and S2 respectively, the outputs of such switches being connected to the emitter of diode-connected transistor Q1. The current produced by current source 12 is I and the current produced by current source 12 is nI, where n is an integer greater than one. Switches S2 and S3 close and switches S1 and S4 open during a first of two phases, (i.e., switches S2 and S3 close during the first phase when pulse P1, shown in FIG. 3, is "high" and switches S1 and S4 open during the first phase when pulse P2 is "low"). Switches S2 and S3 open and switches S1 and S4 close during a second of the two phases, (i.e., switches S2 and S3 open during the second phase when pulse P1, shown in FIG. 3, is "low" and switches S1 and S4 close during the second phase when pulse P2 is "high"). In operation, during the first phase, current nI flows through Q1 and during the second phase current I flows through transistor Q1 producing, during the second phase, a smaller $V_{BE}$ at the emitter of transistor Q1. The difference in $V_{BE}$ produced at the emitter of Q1 (i.e., $\Delta V_{BE}$) is sampled by capacitor C2 and charge corresponding to the sampled difference in $V_{BE}$ is transferred to capacitor C3 during the second phase. Meanwhile, capacitor C1 samples the $V_{BE}$ produced at the emitter of transistor Q1 during the first phase and transfers charge corresponding to this sampled $V_{BE}$ to capacitor C3 during the second phase. It is noted that the capacitor C3 is shunted by switch 16 which closes when pulse P3 goes "high", shown in FIG. 3, and opens when pulse P3 goes "low", such pulse P3 being shown on a common time base with the pulses P1 and P2 in FIG. 3. The expression for the voltage produced at the output of amplifier A1 during the second phase (i.e., when pulse P2 is "high", as shown in FIG. 3) may be expressed as:

$$V_{REF}=[C1/C3]V_{BE}+[C2/C3]\Delta V_{BE}$$

which may alternatively be expressed as:

$$V_{REF}=[C1/C3][V_{BE}+(C2/C1)\Delta V_{BE}],$$

where now $\Delta V_{BE}=V_T \ln(n)$.

It is noted that the ratio of C2/C1 is similar in function to the scale factor G described above in connection with FIG. 1. Thus, the ratio C2/C1 is selected so that $V_{REF}$ is substantially invariant with temperature. Further, the ratio C1/C3 adds additional freedom to enable $V_{REF}$ to be scaled larger or smaller than the bandgap voltage as required. Furthermore, the $\Delta V_{BE}$ is now set by a current ratio, n, rather than by an emitter ratio, N.

If the amplifier A1, in FIG. 2, has an offset $V_{OS}$, then it is possible to show that the second phase voltage is $$V_{REF} = V_{OS} + [C1/C3][V_{BE} + (C2/C1)\Delta V_{BE}].$$

The offset voltage receives much less gain than in the previous linear bandgap reference voltage circuit described above in FIG. 1. It is to be noted, however, that the charge injection at the falling edge of pulse P3 will still add an error to $V_{REF}$.

One application of a bandgap reference circuit is in a charge balance circuit. One such charge balance circuit is a sigma-delta modulator, such as that shown in FIG. 4. The sigma-delta modulator includes an integrating amplifier (which is comprised of operational amplifier A1 and the integrating capacitors C1) and a pair of summing nodes SN and SP, fed by: (1) an input sampling and charge transfer circuit and, (2) a reference sampling and charge transfer circuit. The output of the operational amplifier A1 is fed to a comparator (via an optional filter, not shown). The comparator is sampled on the rising edge of clock signal, EN, by a D-type flip/flop to produce true and complementary outputs, Y, YB. A controller produces the clock signals EN, P1 and P2. During phase 2 both the upper and lower CREF capacitors produce a charge sample for transfer. These charge samples are of opposite sign, i.e., the charge sample transferred from the upper CREF capacitor causes current to flow from right to left through the summing node to which it is connected while the charge sample transferred from the lower CREF capacitor causes current to flow from left to right through the summing node to which it is connected. The modulator output directs these charge samples to the appropriate summing node to maintain the integrator outputs bounded and thereby balance the charge produced by the reference sampling and charge transfer circuit with the charge produced by the input sampling and charge transfer circuit. Thus, the output Y is a train of pulses, such train having an average value over time proportional to the input signal. Such charge balance circuit may be used as an analog to digital converter to convert the input signal into corresponding digital words as when the train of output pulses is fed by the modulator to a decimation filter, or as a voltage to frequency converter where the train of pulses have a frequency related to the input signal.

More particularly, referring to FIG. 4, a charge balance circuit, here a sigma delta modulator, is shown to include the integrating amplifier which is comprised of operational amplifier A1 and the integrating capacitors C1. The inverting (−) and non-inverting (+) inputs of A1 are connected to nodes SN and SP, respectively. The modulator includes: (1) a reference sampling and charge transfer circuit comprising switches arranged as shown for sampling a reference signal, here bandgap reference voltage, $V_{REF}$, and transferring charge samples corresponding to such sampled reference signal to the integrating capacitors, and (2) an input sampling and charge transfer circuit having switches arranged as shown for sampling an input signal and transferring charge samples corresponding to such sampled input signal to the integrating capacitors. The output of the integrating amplifier is fed to the comparator. The output of the comparator is fed to the D-type flip/flop. The output of the D-type flip/flop (i.e., the modulator output) produces the control signal for some of the switches in the reference sampling and charge transfer circuit. The reference signal, as noted above, is a bandgap reference signal, $V_{REF}$, produced by one of the bandgap reference voltage circuits described above in connection with FIGS. 1 and 2, for example.

In operation, two input capacitors, $C_{IN}$, sample the modulator input voltage, $V_{IN}$, during a first phase and forward, (i.e., transfer) corresponding charge samples to the two summing nodes SN and SP and onto the integrating capacitors, C1, during a second phase. Two reference capacitors, $C_{REF}$, sample the bandgap reference voltage, $V_{REF}$, during the first phase and forward corresponding charge samples to the summing nodes and integrating capacitors, C1, during the second phase. The modulator output signal Y (i.e., the output of the comparator) and its complement YB, determine to which summing node the charge samples from the upper and lower capacitors $C_{REF}$ are delivered. To put it another way, the modulator output Y controls the polarity of the charge samples transferred to the summing nodes by the reference sampling and charge transfer circuit. For example, if Y=logic 0 (and YB=logic 1), the charge sample from the upper capacitor $C_{REF}$ is delivered to SN and that from the lower $C_{REF}$ is delivered to SP. The net result is that $V_{OUT+}$ will increase and $V_{OUT-}$ will decrease by the same amount. Similarly, if Y=logic 1 (and YB=logic 0), the charge sample from the upper capacitor $C_{REF}$ is delivered to SP and that from the lower $C_{REF}$ is delivered to SN. The net result is that $V_{OUT+}$ decreases and $V_{OUT-}$ increases.

Here again, the circuit used to produce the bandgap reference voltage when the modulator is produced using CMOS technology suffers from the effects described above in connection with FIGS. 1 and 2.

SUMMARY OF THE INVENTION

In accordance with the present invention, a method is provided for providing a reference voltage to a charge balance circuit. The method includes transferring charge corresponding to $V_{BE}$ and charge corresponding to $\Delta V_{BE}$ to a summing node of the charge balance circuit, where $V_{BE}$ is a voltage produced across a p-n junction and where $\Delta V_{BE}$ is a difference in two $V_{BE}$ voltages.

With such method, instead of forming a bandgap reference circuit which produces a bandgap reference voltage and applying such voltage to the reference sampling and charge transfer circuit of the prior art, charge samples corresponding to $V_{BE}$ and $\Delta V_{BE}$ are transferred to an input summing node of the modulator in correct proportion and with a polarity corresponding to the modulator output. Thus, the reference sampling and charge transfer circuit of this invention delivers $V_{BE}$ and $\Delta V_{BE}$ charge samples to the summing node having the correct proportion and polarity, that in aggregate over a modulator cycle, equal the charge that sampling the reference voltage $V_{REF}$ produced by the circuits described above in connection with FIGS. 1 and 2 deliver.

Thus, instead of providing an explicit bandgap reference voltage circuit (e.g., from a bandgap reference voltage circuit such as shown in FIG. 1 or 2), an implicit bandgap voltage is produced by generating and transferring charge corresponding to $V_{BE}$ and $\Delta V_{BE}$ as part of the modulator operation.

In accordance with another feature of the invention, charge corresponding to an input signal is also fed to the summing node together with the charge corresponding to $V_{BE}$ and $\Delta V_{BE}$.

In accordance with another feature of the invention, a sigma delta modulator is provided having a circuit for sampling a $V_{BE}$ voltage and transferring charge samples corresponding to $V_{BE}$ and $\Delta V_{BE}$ to a summing node of the modulator, where $V_{BE}$ is a voltage produced across a p-n junction and where $\Delta V_{BE}$ is a difference between two $V_{BE}$ voltages. The modulator includes a circuit for sampling an input signal and transferring charge samples corresponding to the input signal to the summing node together with the charge samples corresponding to $V_{BE}$ and $\Delta V_{BE}$.

With such an arrangement, the need for a separate amplifier A1 described in FIGS. 1 and 2 can be eliminated.

BRIEF DESCRIPTION OF THE DRAWING

These and other features of the invention, as well as the invention itself, will become more readily apparent from the following detailed description when taken together with the accompanying drawings, in which.

DESCRIPTION OF THE PREFERRED EMBODIMENTS

Figure 1:
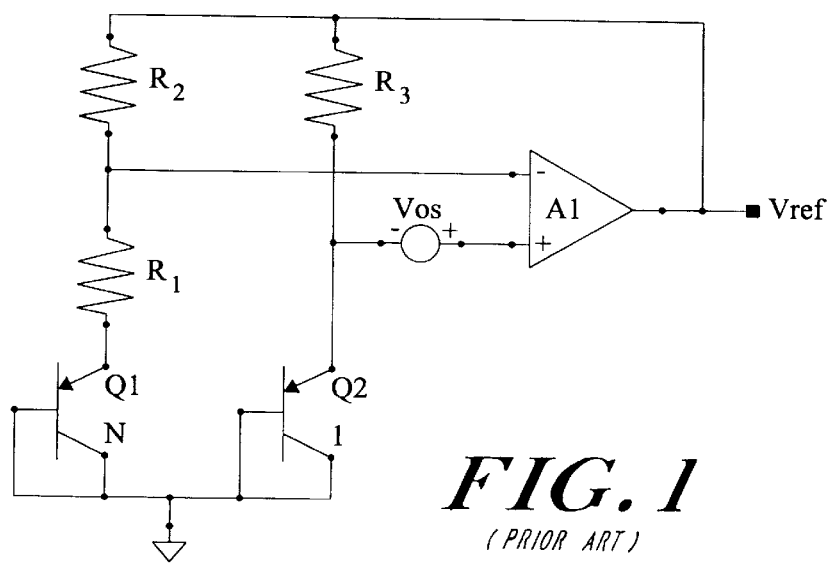
FIG. 1 is a schematic diagram of a CMOS bandgap reference circuit according to the PRIOR ART.
Figure 2:
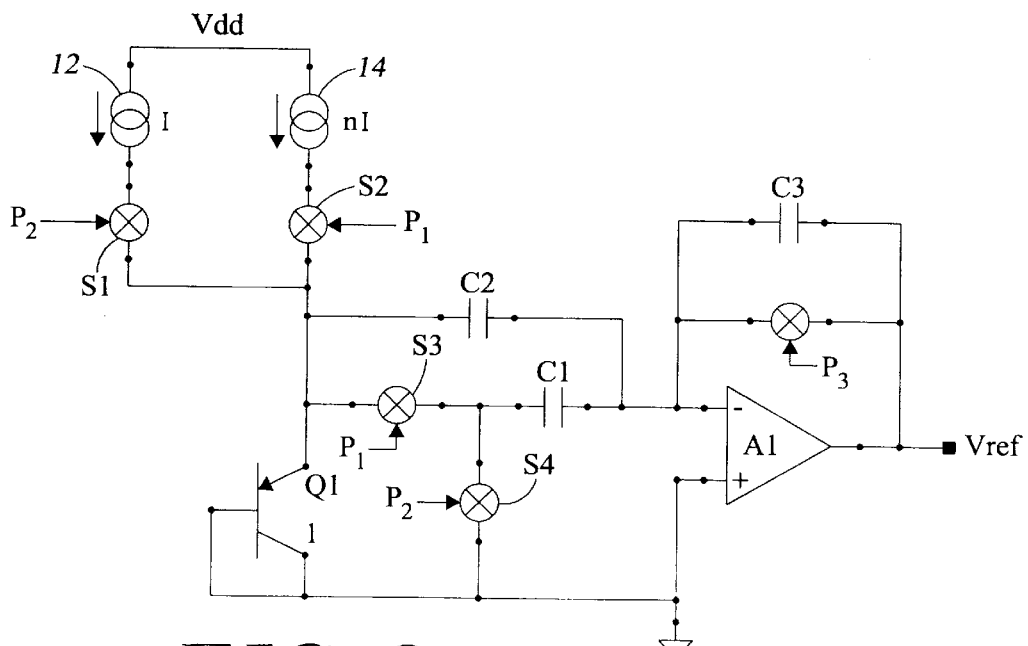
FIG. 2 is a schematic diagram of a switched-capacitor CMOS bandgap reference circuit according to the PRIOR ART.
Figure 3:
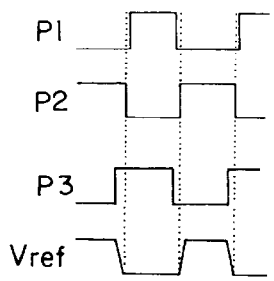
FIG. 3 is a timing diagram of pulses used in the operation of the switched-capacitor CMOS bandgap reference voltage circuit of FIG. 2 according to the PRIOR ART.
Figure 4:
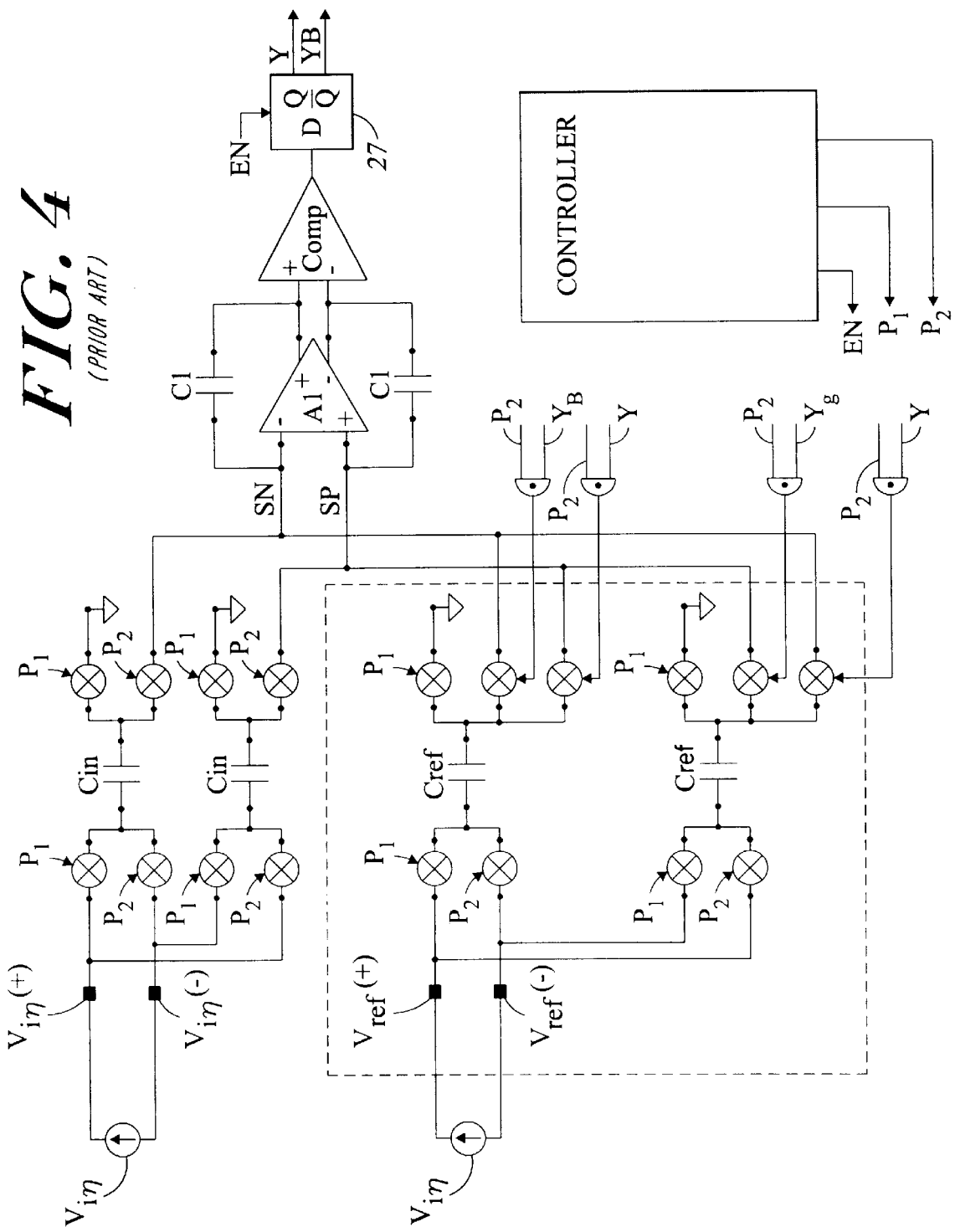
FIG. 4 is a schematic diagram of a sigma delta modulator having its reference input driven by bandgap reference voltage circuits according to the PRIOR ART.
Figure 5:
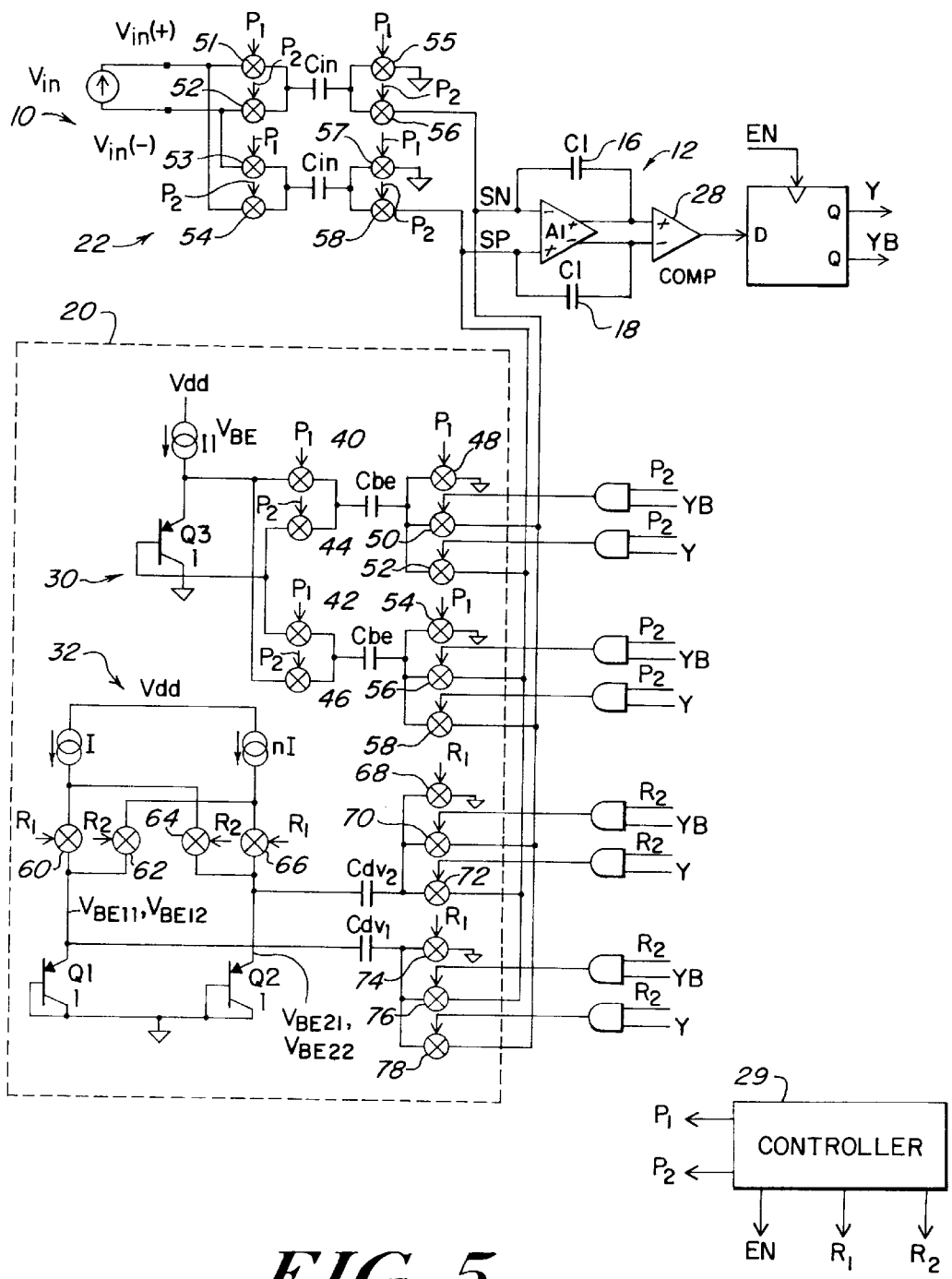
FIG. 5 is a schematic diagram of a charge balance circuit, here a sigma delta modulator, according to the invention.

Referring now to FIG. 5, a charge balance circuit 10, here a sigma delta modulator, is shown to include an implicit bandgap reference voltage. More particularly, the modulator 10 includes an integrating amplifier 12 having a pair of integrating capacitors 16, 18 for producing an output indicative of an amount of charge held on the integrating capacitors 16, 18. The modulator 10 includes a reference sampling and charge transfer circuit 20 for: (1) sampling a voltage $V_{BE}$ and transferring corresponding charge samples to the summing nodes SN and SP; and, (2) transferring charge samples corresponding to $\Delta V_{BE}$ to the summing nodes SN and SP, where $\Delta V_{BE}$ is a difference in two $V_{BE}$ voltages. More particularly, charge samples corresponding to $V_{BE}$ and $\Delta V_{BE}$ are transferred to the pair of summing nodes SN and SP, of the modulator 10 in correct proportion and with a polarity corresponding to the modulator output such that the charge delivered by the reference sampling and charge transfer circuit is equal to that delivered by the reference sample and charge transfer circuitry of FIG. 4 when sampling an explicit bandgap reference voltage $V_{REF}$.

The modulator 10 also includes an input sampling and charge transfer circuit 22 for sampling an input signal and transferring charge samples corresponding to such sampled input signal to the integrating capacitors 16, 18.

More particularly, the input sampling and charge transfer circuit 22 is identical to that described above in connection with FIG. 4 and includes a pair of input capacitors $C_{IN}$ and switches S1–S8 arranged as shown. Switches S1, S3, S5, and S7 are closed during a first phase of the modulator 10 when the logic signal on line P1 is "high" (FIG. 6A) and such switches S1, S3, S5, and S7 are open during a second phase of the modulator 10 when the logic signal on line P1 is "low". Switches S2, S4, S6, and S8 are closed during the second phase of the modulator 10 when the logic signal on lines P2 is "high" (FIG. 6A) and such switches S2, S4, S6, and S8 are open during the first phase of the modulator 10 when the logic signal on line P2 is "low". It is noted that switch S1 is coupled between the positive (+) terminal of the input signal and the upper capacitor $C_{IN}$ and the switch S2 is coupled between the negative (−) terminal of the input signal and the upper capacitor $C_{IN}$. Switch S3 is coupled between the negative (−) terminal of the input signal and the lower capacitor $C_{IN}$ and the switch S4 is coupled between the positive (+) terminal of the input signal and the lower capacitor $C_{IN}$. Switch S7 is coupled between the lower capacitor $C_{IN}$ and ground, or some other fixed voltage, and the switch S8 is coupled between the lower capacitor $C_{IN}$ and the summing node SP. It is noted that switch S5 is coupled between the upper capacitor $C_{IN}$ and ground and the switch S6 is coupled between the upper capacitor $C_{IN}$ and the summing node SN.

In operation, during the first phase of the modulator (i.e., when pulse P1 is "high" and pulse P2 is "low"), switches S1 and S5 close while switches S2 and S6 open so that the voltage at Vin (+) is sampled and charge corresponding to such sample of the input signal at Vin (+) is stored on the upper capacitor $C_{in}$. Likewise, during the first phase of the modulator cycle, switches S3 and S7 close while switches S4 and S8 open so that the voltage at Vin (−) is sampled and charge corresponding to such sample of the input signal at Vin (−) is stored on the lower capacitor $C_{in}$. During the second phase of the modulator cycle (i.e., when pulse P1 is "low" and pulse P2 is "high"), switches S1 and S5 open while switches S2 and S6 close so that a charge sample corresponding to Vin is transferred to the summing node SN. Likewise, during the second phase of the modulator cycle, switches S3 and S7 open while switches S4 and S8 close so that a complementary charge sample (i.e., a charge sample of opposite polarity, or direction of flow from that at node SN) is transferred to the node SP.

The inverting input (−) of the amplifier A1 is connected to node SN and the non-inverting input (+) of amplifier A1 is connected to node SP. Thus, at the end of the second phase, capacitors 16 and 18 holds charge corresponding to the sampled input signal Vin.

The differential output of the integrating amplifier is coupled, through an optional filter, not shown, to the differential input of a comparator 28. The output of the comparator 28 is fed to a D-type flip/flop 27 which produces control signal Y and its complement YB. A controller produces the clock signals, EN, and pulses on lines P1, P2, R1, and R2, shown in FIGS. 6A–6C. The control signal Y and YB, in conjunction with these clocks, controls the polarity of charge samples transferred to the sampling nodes SN, SP by the reference sampling and charge transfer circuit in a manner to be described.

The reference sampling and charge transfer circuit 20 includes a $V_{BE}$ sampling and charge transfer section 30 and a $\Delta V_{BE}$ sampling and charge transfer section 32. The $V_{BE}$ sampling and charge transfer section 30 includes a diode-connected bipolar transistor Q3 to provide a p-n junction between ground and current source I1. Thus, the emitter of transistor Q3 provides a voltage $V_{BE}$. A switch 40 is connected between the emitter of transistor Q3 and an upper capacitor $C_{be}$ and switch 42 is connected between ground and a lower capacitor $C_{be}$. A switch 46 is connected between the emitter of transistor Q3 and the lower capacitor $C_{be}$ and switch 44 is connected between ground and the upper capacitor $C_{be}$. The $V_{BE}$ sampling and charge transfer section 30 also includes switches 48, 50, 52, 54, 56 and 58. Switch 48 is connected between the upper capacitor $C_{be}$ and ground, switch 50 is connected between the upper capacitor $C_{be}$ and node SN, and switch 52 is connected between upper capacitor $C_{be}$ and node PS. Switch 54 is connected between the lower capacitor $C_{be}$ and ground, switch 56 is connected between the lower capacitor $C_{be}$ and node SP, and switch 58 is connected between lower capacitor $C_{be}$ and node SN.

Figure 6:
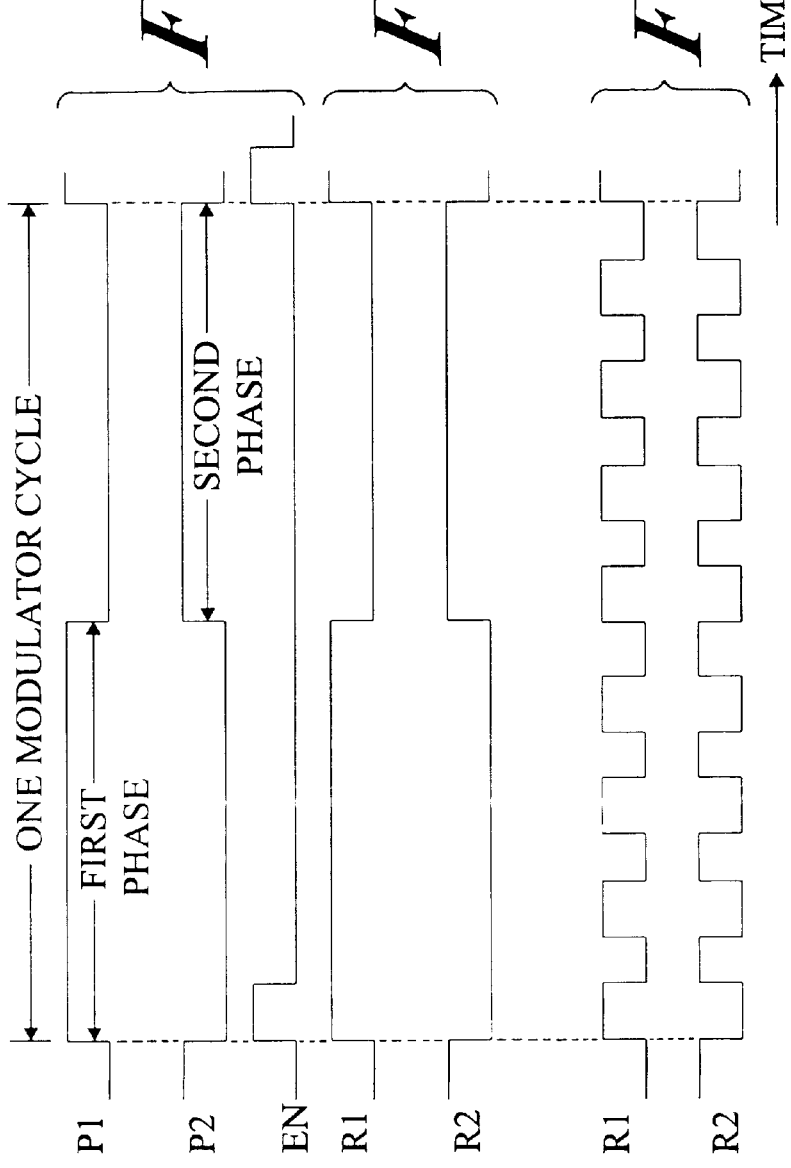
FIGS. 6A, 6B and 6C are timing diagrams of pulses used in the modulator of FIG. 5.

During the first phase of the modulator cycle, the pulse on line P1 is "high" and the pulse on line P2 is "low" (FIG. 6A). Thus, during the first phase of the modulator cycle, the voltage $V_{BE}$ at the emitter of transistor Q1 is sampled and charge corresponding thereto is stored on the upper capacitor $C_{be}$. Likewise, during the first phase of the modulator cycle, the operation of switches 42 and 54 results in ground being sampled by the lower capacitor $C_{be}$. During the second phase of the modulator cycle, the pulse on line P1 is "low" and the pulse on line P2 is "high". Thus, during the second phase of the modulator cycle, the upper capacitor $C_{be}$ samples ground and the lower capacitor $C_{be}$ samples $V_{BE}$. Therefore, a charge sample corresponding to $V_{BE}$ is transferred from the upper capacitor $C_{be}$ to one of the summing nodes SN or SP depending on the logic states of the signal Y and YB. Likewise, a complementary charge sample (i.e., a charge sample of opposite polarity, or direction of flow) is transferred from the lower capacitor $C_{be}$ to the other one of the summing nodes SN, SP.

The $\Delta V_{BE}$ sampling and charge transfer section 32 includes a pair of grounded, diode-connected bipolar transistors Q1 and Q2 providing a corresponding pair of p-n junctions. A switch 60 is connected between a current source I and the emitter of transistor Q1. A switch 62 is connected between a current source nI and the emitter of transistor Q1, where n is an positive integer greater than one. A switch 64 is connected between the current source I and the emitter of transistor Q2. A switch 66 is connected between current source nI and the emitter of transistor Q2. During the first phase of the modulator cycle, switches 60 and 66 are closed by a "high" signal on line R1 while switches 62 and 64 are open by a "low" signal on line R2 (FIG. 6B). Thus, during the first phase of the modulator cycle, a voltage $V_{BE11}$ is produced at the emitter of transistor Q1 by current from current source I passing through such transistor Q1 and a voltage $V_{BE21}$ is produced at the emitter of transistor Q2 by an n times larger current from current source nI passing through such transistor Q2. Thus, a voltage $\Delta V_{BE1}=V_{BE21}-V_{BE11}$ will be produced between the emitters of transistors Q1 and Q2. During the second phase of the modulator cycle, a voltage $V_{BE12}$ is produced at the emitter of transistor Q1 by current from current source nI passing through such transistor Q1 and a voltage $V_{BE22}$ is produced at the emitter of transistor Q2 by an n times smaller current from current source I passing through such transistor Q2. Therefore, a voltage $\Delta V_{BE2}=V_{BE22}-V_{BE12}$ will be produced between the emitters of transistors Q1 and Q2 during the second phase; it being noted that the polarity of the voltage between the emitters is reversed from the polarity produced during the first phase of the modulator cycle.

The $\Delta V_{BE}$ sampling and charge transfer section 32 also includes an upper capacitor $C_{dv2}$ and a lower capacitor $C_{dv1}$ coupled to the emitters of transistors Q2 and Q1, respectively. Switches 68, 70, and 72 are connected at one terminal to the upper capacitor $C_{dv2}$ and at the other terminal to ground, summing node SN and summing node SP, respectively. Switches 74, 76, and 78 are connected at one terminal to the lower capacitor $C_{dv1}$ and at the other terminal to ground, summing node SP and summing node SN, respectively.

During the first phase of the modulator cycle, switches 68 and 74 close while switches 70, 72, 76 and 78 are open so that the upper capacitor $C_{dv2}$ stores charge corresponding to the sampled voltage $V_{BE21}$ at the emitter of transistor Q2 during the first phase and the lower capacitor $C_{dv1}$ stores charge corresponding to the sampled voltage $V_{BE11}$ at the emitter of transistor Q1 during the first phase. During the second phase of the modulator cycle, switches 68 and 74 open in response to a "low" signal on line R1. If, during the second phase (i.e., when the signal on line R2 is "high"), the signal Y is "high", switches 72 and 78 close in response to a "high" signal on line Y while switches 70 and 76 open in response to a "low" signal on line YB thereby transferring a charge sample corresponding to $V_{BE21}-V_{BE22}=\Delta V_{BE3}$ from the upper capacitor $C_{dv2}$ to node SP and a charge sample corresponding to $V_{BE11}-V_{B12}=-\Delta V_{BE4}$ from the lower capacitor $C_{dv1}$ to node SN. On the other hand, if, during the second phase (i.e., when the signal on line R2 is "high"), the signal Y is "low", switches 72 and 78 open in response to a "low" signal on line Y while switches 70 and 76 close in response to a "high" signal on line YB thereby transferring a charge sample corresponding to $V_{BE21}-V_{BE22}=\Delta V_{BE3}$ from the upper capacitor $C_{dv2}$ to node SN and a charge sample corresponding to $V_{BE11}-V_{B12}=-\Delta V_{BE4}$ from the lower capacitor $C_{dv1}$ to node PS. Note that because $\Delta V_{BE3}$ and $\Delta V_{BE4}$ depend principally on the current ratio, n, they will be substantially equal:

$$\Delta V_{BE}=\Delta V_{BE3}=\Delta V_{BE4}=V_T ln(n)$$

In summary, a $\Delta V_{BE}$ is formed by alternatively switching I and nI through transistors Q1 and Q2 with complementary signals on lines R1 and R2. The $V_{BE}$ voltage is generated by a separate bipolar transistor Q3 operating at current I1.

The relative size of the $V_{BE}$ and $\Delta V_{BE}$ charge samples transferred by the capacitors can be set by the two capacitors, $C_{be}$ and $C_{dv}$, (where here $C_{dv}=C_{dv1}=C_{dv2}$) which would have to be in a ratio of about 1:10, respectively. Further, the sampling rate used for the $V_{BE}$ sampling and charge transfer section may be different from the sampling rate used for the $\Delta V_{BE}$ sampling and charge transfer section. For example, let $f_R$ be the rate at which $\Delta V_{BE}$ charge samples are transferred to the sampling nodes SN, SP and let $f_P$ be the sampling rate at which $V_{BE}$ charge samples are transferred to the same sampling nodes. More particularly, $f_R$ is the rate of the pulses on lines R1 and R2 in FIG. 6B and FIG. 6C and $f_P$ is the rate of P1 and P2 in FIG. 6A. An additional gain, $m=f_R/f_P$ results. FIG. 6C shows a timing diagram where m=8. Note that the frequency $f_P$ is here assumed to be the same as the modulator frequency in this preferred embodiment. Such need not be the case.

It is possible to write an expression for the equivalent (i.e., implicit) bandgap reference voltage $V_{IMP}$ which had it been applied to the circuit 30 alone, would have resulted in the same net charge transfer:

$$V_{IMP}=V_{BE}+m(C_{dv}/C_{be})(\Delta V_{BE})=V_{BE}+m(C_{dv}/C_{be})(V_T)(ln(n)).$$

In this example, n=15 and m=8. $\Delta V_{BE}$ is therefore 70 mV at room temperature and has a temperature coefficient of 233.3 $\mu V/°$ K. To balance the −2 mV/° K. temperature coefficient of the $V_{BE}$ component, $$[C_{dv}/C_{be}]=(1/8)(2000/233.3)=1.072$$

and $$V_{IMP}=0.65+8(1.072)(0.07)=1.25 \text{ Volts}$$

It can be seen that this choice of design parameters results in a capacitor ratio of almost unity. In practice both $C_{dv}$ and $C_{be}$ would be made of an integral number of smaller unit capacitors. For example, 16 smaller, equal capacitors for $C_{dv}$ and 15 such capacitors for $C_{be}$ would give a ratio of 1.067, which is very close to the desired 1.072.

There are techniques to eliminate the effect of operational amplifier 1/f noise in this invention. One such technique is described in U.S. Pat. No. 5,479,130, inventor D. McCartney, entitled "Auto-Zero Switched Capacitor Integrator", issued Dec. 26, 1995, assigned to the same assignee as the present invention. We must also consider, however, the 1/f noise of the current sources in the modulator 10 shown in FIG. 5. Variation in current I1, I or nI, due to noise, will result in a small variation in the $V_{BE}$ of the corresponding transistor, Q1, Q2 or Q3. We are more concerned with sources I and nI than I1 because of the higher gain associated with the $\Delta V_{BE}$ sampling and charge transfer section 32. If I and nI derive from a common bias circuit then 1/f noise of the bias circuit will cause noise in the two current sources that is in the same n:1 ratio. It will therefore be rejected, assuming the frequency of the noise is low in comparison with the $f_R$ rate, since the circuit generates a $\Delta V_{BE}$ voltage that is determined by the ratio of the current sources only.

There will be some noise in the current sources that is not common. A technique to eliminate this is will now be described in connection with FIGS. 5 and 6C. Thus, referring to FIGS. 5 and 6C, there are 16 time periods of the pulses on lines R1 and R2 in a full cycle of P1 for m=8. There are also 16 unit current sources for n=15. In each time period, we select a different unit current source to be the I source of the modulator 10, FIG. 5 and the other 15 to be in the nI source. In a full P1 cycle every unit current source will have been used once as the I source. Any low frequency variation will cause some unit sources to be above and some below an average value during any given modulator cycle. The cycling through each of the unit sources ensures that the total $\Delta V_{BE}$ charge delivered in the P1 cycle is the same as if all unit current sources matched perfectly. The 1/f noise that is due to the individual current sources is, therefore, cancelled.

If n were larger or m smaller then it would not be possible to cycle through all unit current sources in a single modulator cycle. One could cycle through them in a multiple of modulator cycles although one would have to assess whether this would result in a mixing down of the shaped noise that is present in the feedback.

Figure 12:
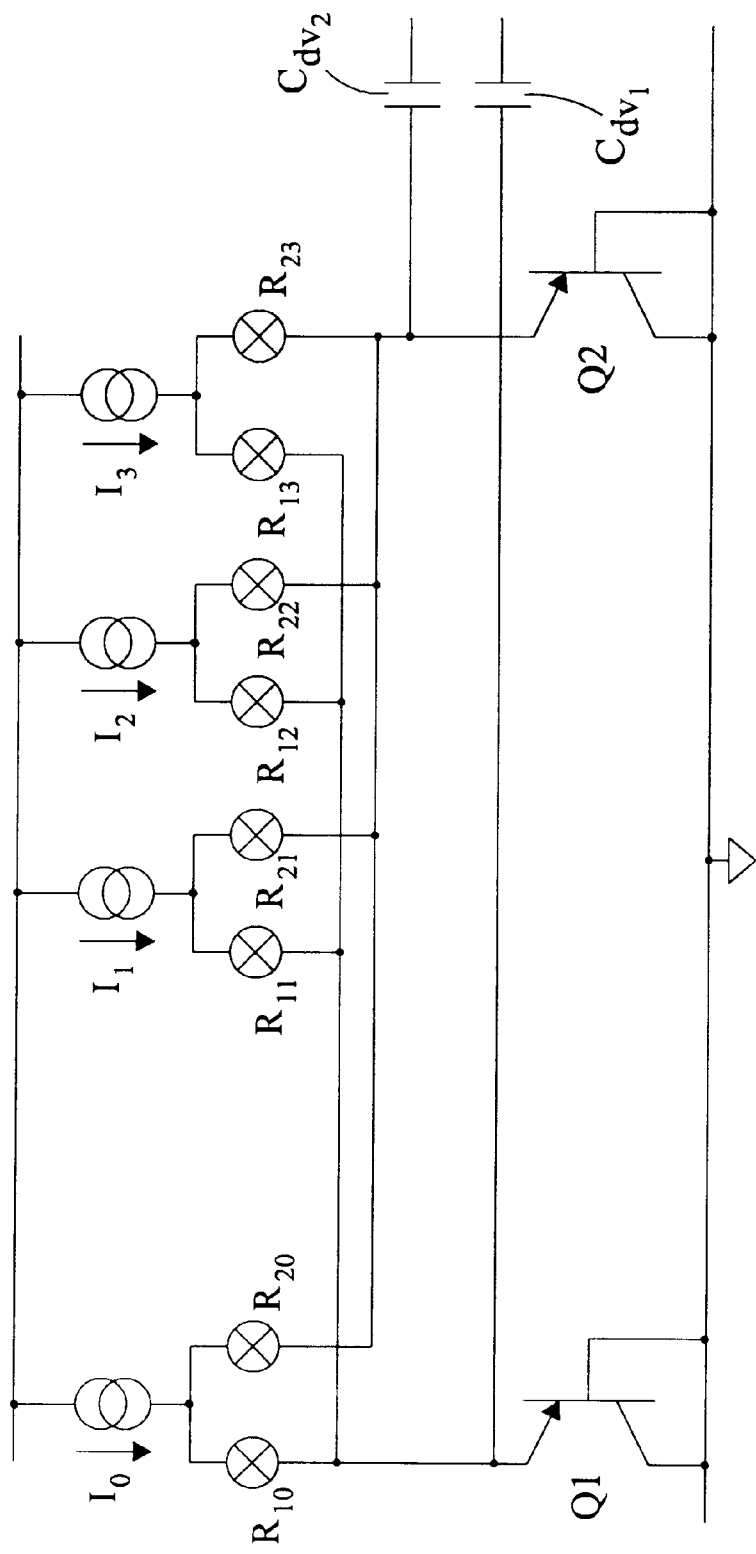
FIG. 12 is a schematic diagram of a reference sampling and transfer circuit according to the invention, such circuit being adapted for use as an alternative circuit to that used in the modulator of FIG. 5.
Figure 13:
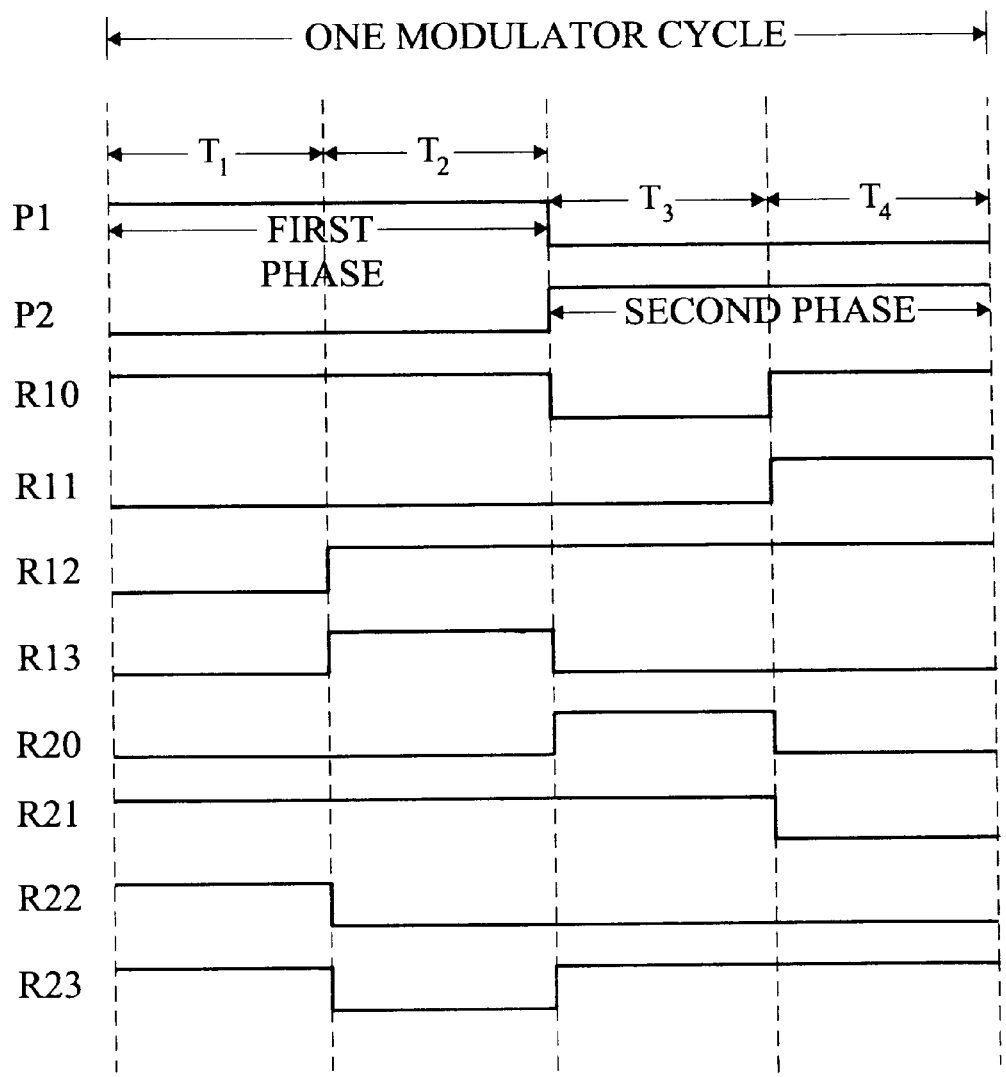
FIG. 13 is a timing diagram of pulses used to operate the modulator of FIG. 5 when such modulator uses the reference sampling and transfer circuit of FIG. 12.

For example, referring to FIG. 12, an alternative $\Delta V_{BE}$ sampling and charge transfer section 32' is shown having a set of n, here 4, individual current sources $I_0$, $I_1$, $I_2$, and $I_3$, where each produces the same nominal current I. That is, $I_0=I_1=I_2=I_3=I$. The pulses R10, R11, R12, R13, R20, R21, R22, R23 control the switches that are connected to the current sources $I_0$–$I_3$, as shown in FIG. 13 along with the pulses P1 and P2. It is understood that the pulses P1, P2, R10, R11, R12, R13, R20, R21, R22, R23 are produced by a suitably modified controller 29 (FIG. 5). Here, m=2, thus there are four time periods, T1, T2, T3 and T4, as indicated. During each one of the four time periods, the current source used to produce the smaller $V_{BE}$ is a different one of the four current sources $I_0$, $I_1$, $I_2$, $I_3$. More particularly, during time period T1, current source $I_0$ is coupled to transistor Q1 and the current sources $I_1$, $I_2$, and $I_3$ are coupled to transistor Q2. During time period T2, current sources $I_0$, $I_2$, and $I_3$ are coupled to transistor Q1 and the current source $I_1$ is coupled to transistor Q2. During time period T3, current source $I_2$ is coupled to transistor Q1 and the current sources $I_0$, $I_1$, and $I_3$ are coupled to transistor Q2. During time period T4, current sources $I_0$, $I_1$ and $I_2$ are coupled to transistor Q1 and the current source $I_3$ is coupled to transistor Q2.

Let it be assumed that:

$I_0$ is actually $I(1+\Delta_0)$, $I_1$ is actually $I(1+\Delta_1)$ $I_2$ is actually $I(1+\Delta_2)$, and $I_3$ is actually $I(1+\Delta_3)$, where $\Delta_0$, $\Delta_1$, $\Delta_2$, and $\Delta_3$ are small and represents low frequency noise and/or relative mismatch between the current sources $I_0$, $I_1$, $I_2$, $I_3$. The total $\Delta V_{BE}$ charge transferred in a full modulator cycle, $Q_T$, is:

$$Q_T = C_{dv}V_T\left[\ln I_1 + I_2 + \frac{I_3}{I_1} + \ln I_0 + I_2 + \frac{I_3}{I_0} + \ln I_0 + I_1 + \frac{I_3}{I_3} + \frac{I_0+I_1+I_2}{I_2}\right]$$

$$Q_T = C_{dv}V_T\left[\ln\left\{3\left(1+\frac{\Delta_1}{3}+\frac{\Delta_2}{3}+\frac{\Delta_3}{3}\right)(1-\Delta_1)\right\} + \right.$$
$$\ln\left\{3\left(1+\frac{\Delta_0}{3}+\frac{\Delta_2}{3}+\frac{\Delta_3}{3}\right)(1-\Delta_0)\right\} +$$
$$\ln\left\{3\left(1+\frac{\Delta_0}{3}+\frac{\Delta_1}{3}+\frac{\Delta_3}{3}\right)(1-\Delta_3)\right\} +$$
$$\left.\ln\left\{3\left(1+\frac{\Delta_0}{3}+\frac{\Delta_1}{3}+\frac{\Delta_2}{3}\right)(1-\Delta_2)\right\}\right]$$

$$Q_T = C_{DV}V_T\left[4\ln(3) + \frac{\Delta_1}{3} + \frac{\Delta_2}{3} + \frac{\Delta_3}{3} - \Delta_1 + \frac{\Delta_0}{3} + \frac{\Delta_2}{3} + \frac{\Delta_3}{3} - \right.$$
$$\left.\Delta_0 + \frac{\Delta_0}{3} + \frac{\Delta_1}{3} + \frac{\Delta_3}{3} - \Delta_3 + \frac{\Delta_0}{3} + \frac{\Delta_1}{3} + \frac{\Delta_2}{3} - \Delta_2\right]$$

$$Q_T = [C_{dv}V_T][4\ln(3)]$$

It should be noted that for small X:
1/(1+X) is approximately 1−X;

ln(1+X) approximately equals X;
for small X and Y, (1+X) (1+Y) approximately equals 1+X+Y.

It is also assumed that $C_{dv1}=C_{dv2}=C_{dv}$.

It will be observed that the mismatch terms $\Delta_0$–$\Delta_3$ cancel to the first order and $Q_T$ above is the same as if there had been perfect matching.

Considering the error $\Delta_1$, for example, such error appears in the example above (i.e., where n=3), 3 times in the numerator and once in the denominator. Thus, the current source $I_1$ is used in 3I three times and once in I.

However, there are other errors in this implicit reference apart from current source mismatch. As noted above:

$$V_{IMP}=V_{BE}+m(C_{dv}/C_{be})(\Delta V_{BE})=V_{BE}+m(C_{dv}/C_{be})(V_T)(ln(n)).$$

Figure 9:
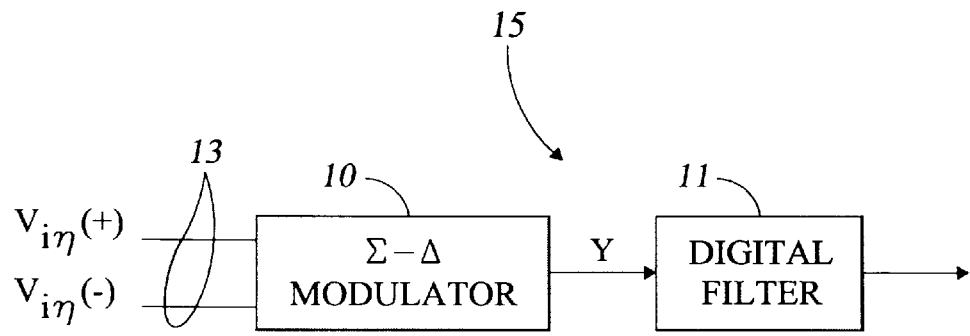
FIG. 9 is a diagram of an analog to digital converter using the charge balance circuit of FIG. 5.

Thus, errors in $V_{BE}$ and in the ratio of $C_{dv}$ to $C_{be}$ would result in the reference voltage, $V_{IMP}$, being different to the desired bandgap voltage. Moreover mismatch between the capacitors $C_{be}$ and $C_{dv}$ and the input capacitor $C_{IN}$ in FIG. 5 would give rise to a modulator gain error which would appear as a reference voltage error to the user were the user to apply a known voltage to the modulator. In practice, capacitor ratios are accurate to about 0.1%, giving a reference error of the order of 1 mV, while $V_{BE}$ errors can be 10 mV or more. To calibrate the modulator, and assuming the $V_{BE}$ error dominates, compensation for it is provided by adding more or less $\Delta V_{BE}$. More particularly, and referring to FIG. 9, the modulator 10 is shown coupled to a digital filter 11 to provide an analog to digital converter 15. A known input voltage is applied to the modulator input 13 and the $\Delta V_{BE}$ term is adjusted until the output code of the analog to digital converter (ADC) 15 is indicative of a correct reference voltage. The $\Delta V_{BE}$ term can be adjusted by changing the value of it's sampling capacitor, $C_{dv}$. However, a finer adjustment can be achieved by varying the current ratio in one or more of the 16 sampling time periods.

Figure 11:
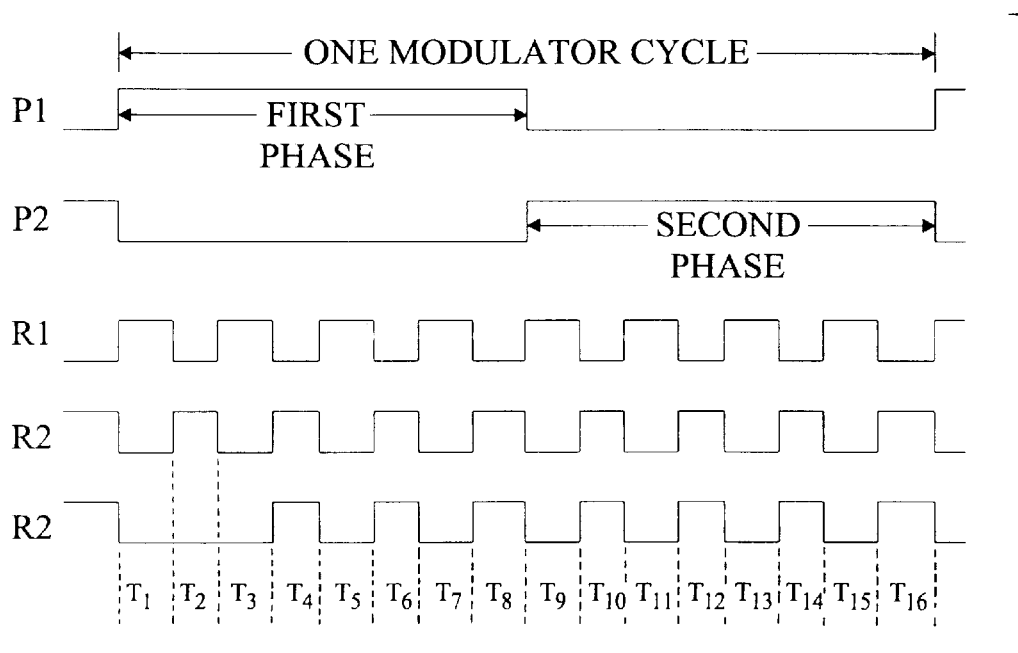
FIG. 11 is a timing diagram of pulses used to operate the modulator of FIG. 5 when such modulator uses the reference sampling and transfer circuit of FIG. 10.
Figure 10:
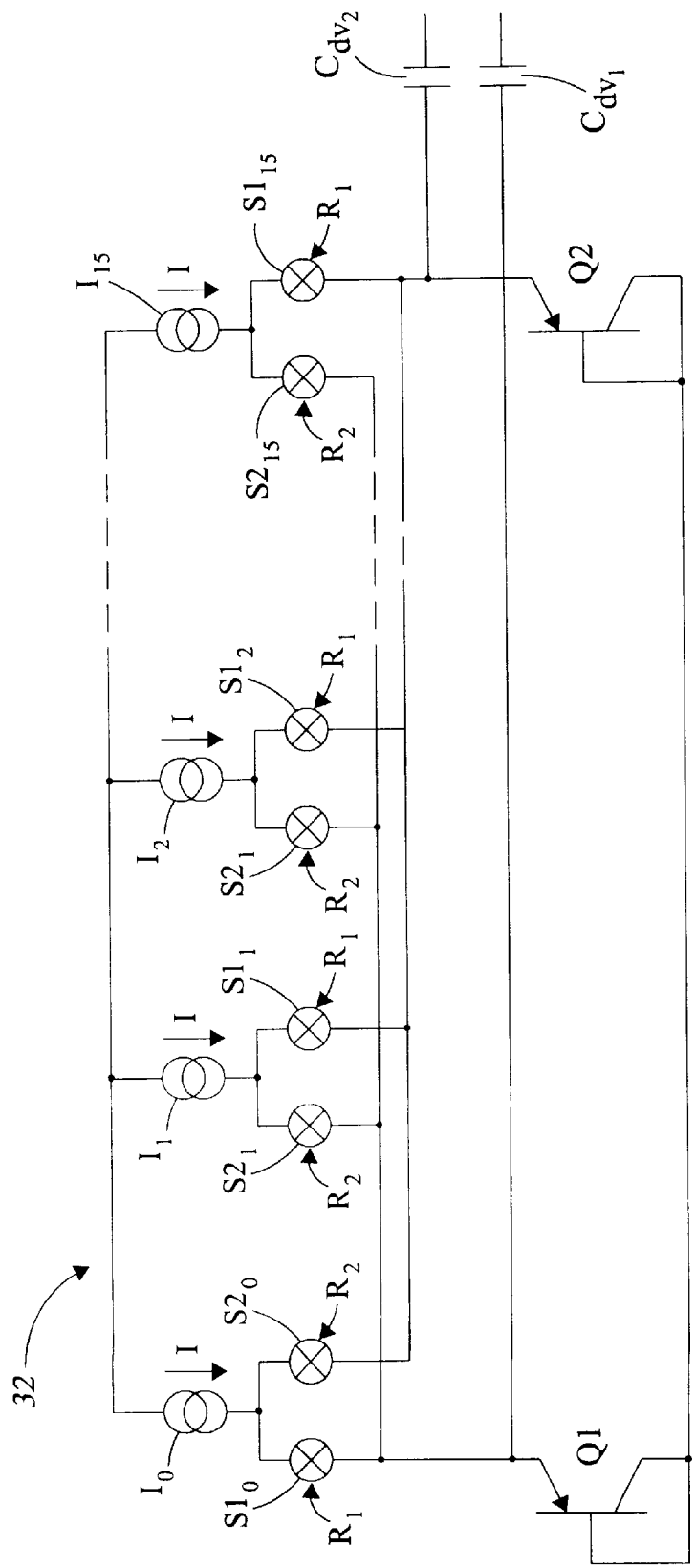
FIG. 10 is a schematic diagram of a reference sampling and transfer circuit according to the invention, such circuit being adapted for use as an alternative circuit to that used in the modulator of FIG. 5.

For example, referring to FIG. 10, an alternative $\Delta V_{BE}$ sampling and charge transfer section 32" is shown having in total n+1, here 16, individual current sources $I_0$–$I_{15}$, each producing the current I, in place of the I and nI current sources shown in FIG. 5 for $\Delta V_{BE}$ sampling and charge transfer section 32. Current source $I_0$ is coupled to transistors $Q_1$ and $Q_2$ by the pulses R1 and R2 controlling the switches $S1_0$, $S2_0$, fed thereto by such pulses R1, R2, respectively, as indicated. Each one of the current sources $I_1$–$I_{15}$ is coupled to a pair of switches, $S1_1$, $S2_1$ to $S1_{15}$, $S2_{15}$, respectively, as indicated. The switches $S2_2$–$S2_{15}$ are controlled by pulses on line R2, such pulses on line R2 being described in connection with FIGS. 6A–6C. The outputs of the switches $S2_1$–$S2_{15}$ are connected to the emitter of transistor Q1 and the lower capacitor $C_{dv1}$, as indicated. The switches $S1_1$–$S1_{15}$ are controlled by pulses R1 described above in connection with FIGS. 6A–6C. The outputs of the switches $S1_1$–$S1_{15}$ are connected to the emitter of transistor $Q_2$ and the upper capacitor $C_{dv2}$, as indicated. The switch $S2_1$ is controlled by pulses on line R2', shown in FIG. 11. Also shown in FIG. 11 are the pulses on lines P1, P2, R1, and R2. It is noted that the pulses P1, P2, R1, R2 and R2' are produced by a suitably modified controller 29 (FIG. 5). Thus, it is noted that during each modulator cycle, there are 16 time periods (i.e., T1–T16) so that m=8. It is also noted that nI=15I. Further, it is noted that while each of the 14 current sources $I_2$–$I_{15}$ supply current to transistor Q1 during each of time periods T2, T4, T6, T8, T10, T12, T14, and T16 while the current source $I_1$ supplies current to Q1 during time periods T4, T6, T8, T10, T12, T14, and T16 of each modulator cycle. Therefore, the current ratio applicable for the $\Delta V_{BE}$ charge sample transferred by $C_{dv1}$ during time period T2 is 14:1 while it is the normal 15:1 current ratio during even time periods T4–T16. Furthermore, the $\Delta V_{BE}$ charge samples transferred by $C_{dv2}$ during the even time periods T2–T16 all have a 15:1 current ratio. Thus, one of the 16$\Delta V_{BE}$ charge samples has had its current ratio reduced from 15:1 to 14:1. The net effect is a decrease of 0.9 mv in $V_{IMP}$ (where $V_{IMP}$ is the effective bandgap voltage as described above).

To achieve a similar increase in $V_{IMP}$ one could provide a 17th current source $I_{16}$ that is switched in with the current sources $I_1$–$I_{15}$ during one of the time periods, thereby giving a 16:1 current ratio for one of the $\Delta V_{BE}$ charge samples. If we increase the ratio to 16:1 on one of time periods, this results in an increase of about 0.9 mV in $V_{IMP}$. Changing the ratio to 15:2 on time period, gives a coarser adjustment of about −9.6 mV in $V_{IMP}$. To be able to make coarse adjustments in both directions it would be necessary to initially have a number of time periods at 15:2. This in turn would require different current ratios or different capacitor ratios to ensure the initial $V_{IMP}$ was correct. A combination of fine and coarse adjustments would normally be required to correct the reference error.

Figure 7:
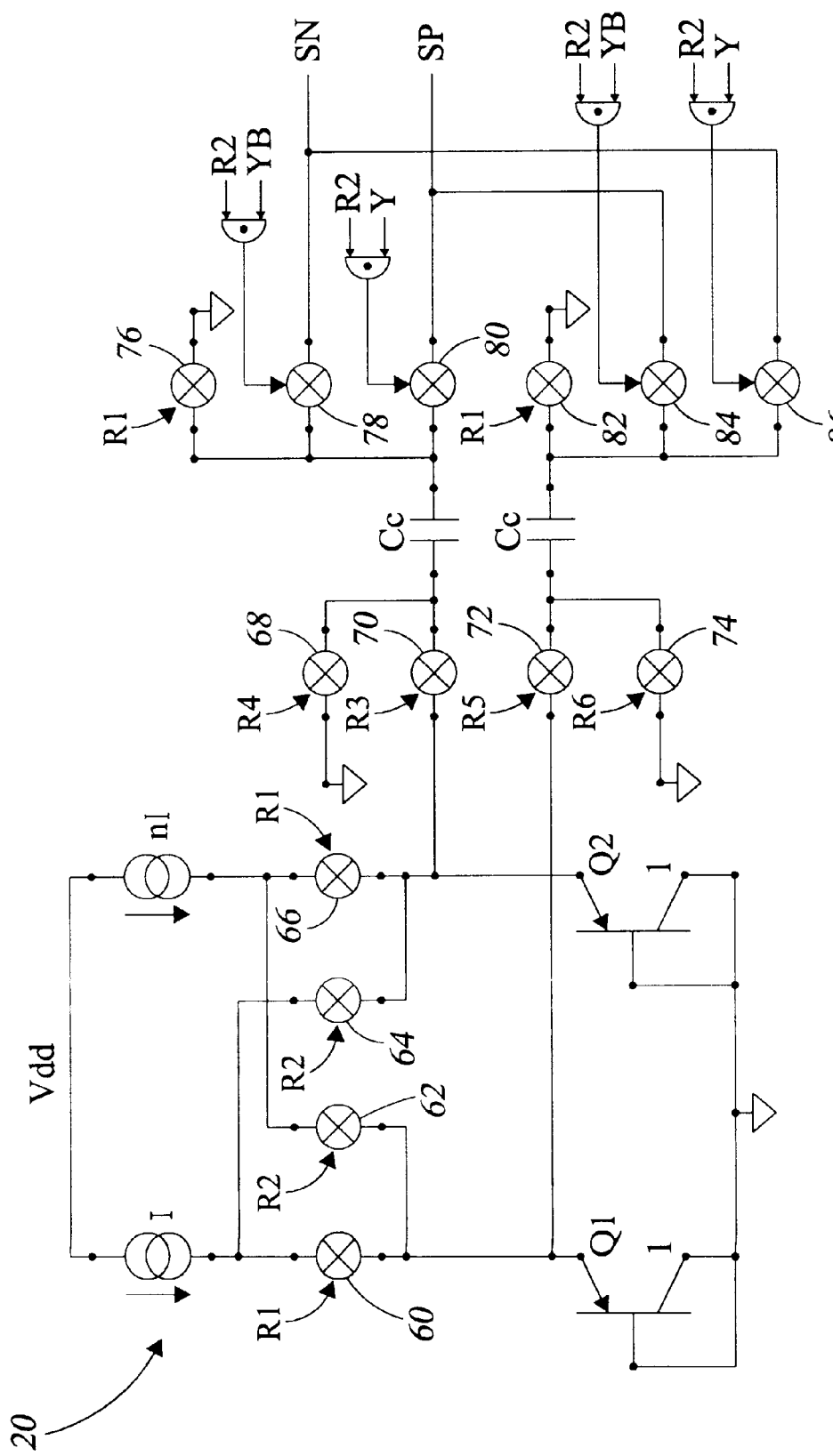
FIG. 7 is a schematic diagram of a reference sampling and transfer circuit according to the invention, such circuit being adapted for use as an alternative circuit to that used in the modulator of FIG. 5.
Figure 8:
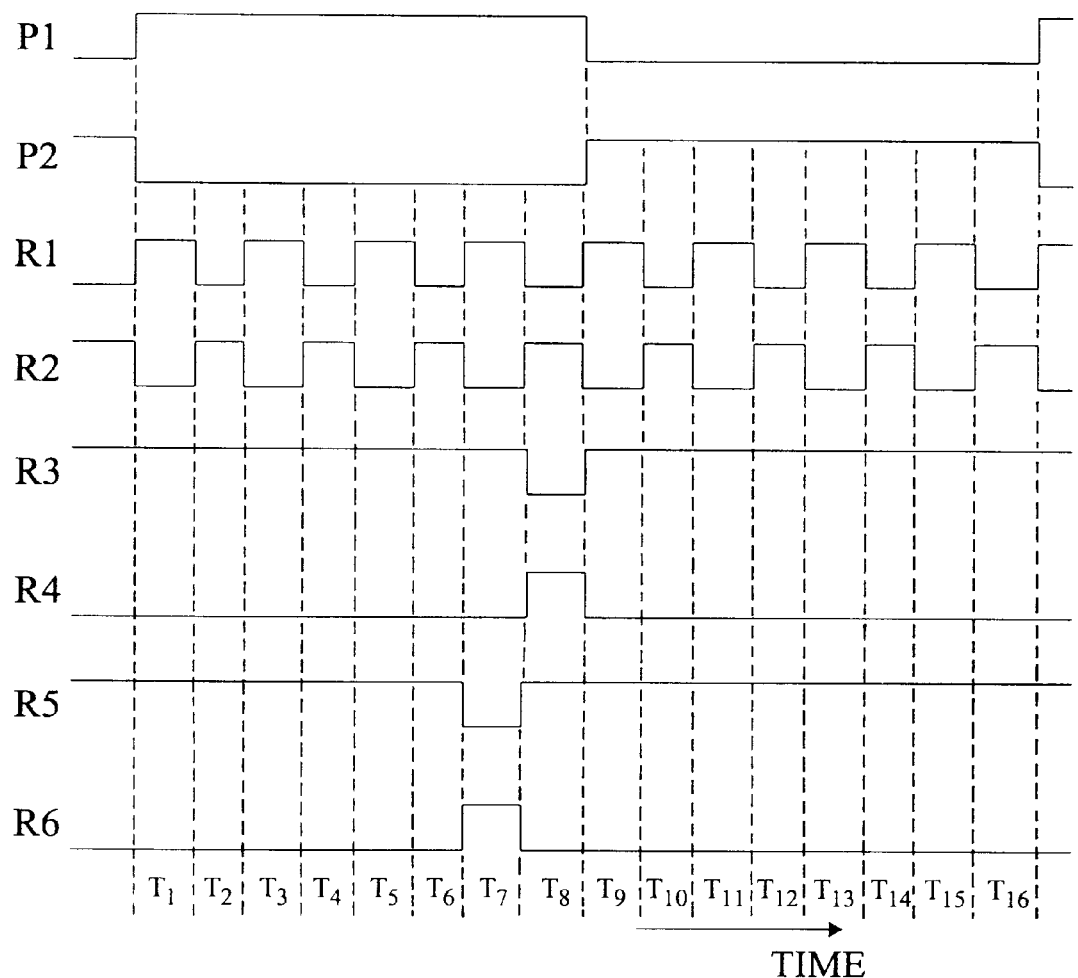
FIG. 8 is a timing diagram of pulses used to operate the modulator of FIG. 5 when such modulator uses the reference sampling and transfer circuit of FIG. 7.

Referring now to FIG. 7, an alternative reference sampling and charge transfer circuit 20' is shown. Here, rather than have separate sampling and charge transfer sections for $V_{BE}$ and $\Delta V_{BE}$ (i.e., a $V_{BE}$ sampling and charge transfer section 30 and a $\Delta V_{BE}$ sampling and charge transfer section 32, as in the modulator 10 of FIG. 5) here circuit 20' provides samples of both $V_{BE}$ and $\Delta V_{BE}$. A schematic of one possible way this might be done is shown in FIG. 7. The corresponding timing diagram appears in FIG. 8; it being understood that the controller 29 (FIG. 5), suitably modified to produce pulses R3, R4, R5, and R6 shown in FIG. 8. Now there are 7 $\Delta V_{BE}$ samples per $V_{BE}$ sample.

More particularly, charge samples corresponding to $\Delta V_{BE}$ are transferred to the nodes SN and SP with polarity depending on the signals Y and YB during periods of time T2, T4, T6, T10, T12, T14, and T16. Similarly, charge samples corresponding to $V_{BE}$ are transferred to the nodes SN or SP with polarity depending on signals Y and YB during period of time T8. It is noted that there is a single pair of sampling capacitors $C_c$, so that there is no longer the degree of freedom of being able to choose a capacitor ratio to scale the relative size of the samples. A different current ratio, n, is therefore appropriate.

Other embodiments are within the spirit and scope of the appended claims.

What is claimed is:

1. A method for providing a reference voltage to a charge balance circuit, comprising:
    transferring charge corresponding to $V_{BE}$ and charge corresponding to $\Delta V_{BE}$ to a summing node of the charge balance circuit, where $V_{BE}$ is a voltage produced across a p-n junction and where $\Delta V_{BE}$ is a difference in two $V_{BE}$ voltages.

2. The method recited in claim 1 further comprising transferring charge corresponding to an input signal to the summing node together with the charge corresponding to $V_{BE}$ and the charge corresponding to $\Delta V_{BE}$.

3. A method for operating a sigma delta modulator, comprising:
    transferring charge corresponding to $V_{BE}$ and charge corresponding to $\Delta V_{BE}$ to a summing node of the modulator, where $V_{BE}$ is a voltage produced across a p-n junction and where $\Delta V_{BE}$ is a difference in two $V_{BE}$ voltages.

4. The method recited in claim 3 further comprising transferring charge corresponding to an input signal to the summing node together with the charge corresponding to $V_{BE}$ and the charge corresponding to $\Delta V_{BE}$.

5. The method recited in claim 3 further comprising controlling the polarity of the transferred charge in accordance with an output of the modulator.

6. The method recited in claim 3 wherein the charge transfer comprises transferring charge samples and wherein the charge samples corresponding to $\Delta V_{BE}$ are fed to the summing node at a different frequency than the frequency charge samples corresponding to $V_{BE}$ are transferred to the summing node.

7. A sigma delta modulator, comprising:
    a summing node; and
    a circuit for transferring charge corresponding to $V_{BE}$ and charge corresponding to $\Delta V_{BE}$ to the summing node, where $V_{BE}$ is a voltage produced across a p-n junction and where $\Delta V_{BE}$ is a difference in two $V_{BE}$ voltages.

8. The modulator recited in claim 7 further comprising a circuit for transferring charge corresponding to an input signal to the summing node together with the charge corresponding to $V_{BE}$ and the charge corresponding to $\Delta V_{BE}$.

9. The modulator recited in claim 7 further comprising a controller for controlling the polarity of the transferred charge in accordance with an output of the modulator.

10. The modulator recited in claim 7 comprising transferring charge as charge samples and further comprising a controller for transferring charge samples corresponding to $\Delta V_{BE}$ to the summing node at a different frequency than the frequency charge samples corresponding to $V_{BE}$ are transferred to the summing node.

11. A charge balance circuit, comprising:
    a summing node;
    an input sampling and charge transfer circuit for sampling an input signal and transferring corresponding charge samples to the summing node; and
    a reference sampling and charge transfer circuit for sampling a $V_{BE}$ voltage and transferring charge samples corresponding to such sampled $V_{BE}$ and charge samples corresponding to a difference between two sampled $V_{BE}$ voltages to the summing node, where $V_{BE}$ is a voltage produced across a p-n junction.

12. The charge balance circuit recited in claim 11 further comprising a controller for controlling the polarity of the $V_{BE}$ and $\Delta V_{BE}$ charge samples transferred to the summing node by the reference sampling and charge transfer circuit.

13. A circuit, comprising:
    a summing node;
    an input sampling and charge transfer circuit for sampling an input signal and for transferring corresponding charge samples to the summing node; and
    a reference sampling and charge transfer circuit for sampling a $V_{BE}$ voltage and transferring charge samples corresponding to such sampled $V_{BE}$ voltage and charge samples corresponding to $\Delta V_{BE}$ to the summing node, where $\Delta V_{BE}$ is a difference between two sampled $V_{BE}$ voltages;
    an integrator having an input coupled to the summing node;
    a comparator coupled to the integrator; and
    wherein an output of the comparator controls the polarity of the $V_{BE}$ and $\Delta V_{BE}$ charge samples transferred to the summing node.

14. A circuit, comprising:
    an integrating amplifier having an integrating capacitor for producing an output indicative of an amount of charge held on the integrating capacitor;
    a reference sampling and charge transfer circuit for sampling a $V_{BE}$ voltage and transferring charge samples corresponding to $V_{BE}$ and charge samples corresponding to $\Delta V_{BE}$ to the integrating capacitor where $\Delta V_{BE}$ is a difference between two $V_{BE}$ voltages; and
    an input sampling and charge transfer circuit for sampling an input signal and transferring charge samples corresponding to such sampled input signal to the integrating capacitor.

15. The circuit recited in claim 14 further comprising a controller for controlling the polarity of the $V_{BE}$ and $\Delta V_{BE}$ charge samples transferred to the summing node by the reference sampling and charge transfer circuit.

16. The circuit recited in claim 14 further comprising a controller for transferring the charge samples corresponding to $\Delta V_{BE}$ to the summing node at a different frequency than the frequency the charge samples corresponding to $V_{BE}$ are transferred to the summing node.

17. A sigma-delta modulator, comprising:
    a summing node;
    a $V_{BE}$ sampling and charge transfer section for sampling a $V_{BE}$ voltage and transferring charge samples corresponding to such sampled $V_{BE}$ voltage to the summing node; and
    a $\Delta V_{BE}$ sampling and charge transfer section for sampling a pair of $V_{BE}$ voltages and transferring charge samples corresponding to $\Delta V_{BE}$ to the summing node, where $\Delta V_{BE}$ is a difference between the pair of $V_{BE}$ voltages.

18. A sigma-delta modulator, comprising:
    a summing node;
    a $V_{BE}$ sampling and charge transfer section for sampling a $V_{BE}$ voltage and transferring charge samples corresponding to such sampled $V_{BE}$ voltage to the summing node and for sampling a pair of $V_{BE}$ voltages and transferring charge samples corresponding to $\Delta V_{BE}$ to the summing node, where $\Delta V_{BE}$ is a difference between the pair of $V_{BE}$ voltages; and
    wherein the $V_{BE}$ charge samples are transferred to the summing node during different time intervals than time intervals when the $\Delta V_{BE}$ charge samples are transferred to the summing node.

19. A method for calibrating an analog to digital converter having a sigma-delta modulator, comprising;
    sampling a $V_{BE}$ voltage and transferring charge samples corresponding to such sampled $V_{BE}$ voltage to a summing node of the modulator;
    sampling a pair of $V_{BE}$ voltages and transferring charge samples corresponding to $\Delta V_{BE}$ to the summing node, where $\Delta V_{BE}$ is a difference between said pair of sampled $V_{BE}$ voltages; and
    applying a known input voltage to the analog to digital converter and adjusting the magnitude of the $\Delta V_{BE}$ charge samples until the output of the analog to digital converter equals a predetermined value.

20. The method recited in claim 19 wherein the adjustment comprises changing the value of a capacitor used to transfer the $\Delta V_{BE}$ charge samples to the summing node of the modulator.

21. The method recited in claim 19 wherein:
    a reference sampling and charge transfer circuit of the modulator includes a plurality of, n, current sources;

wherein a first one of the pair of $V_{BE}$ voltages is produced by connecting a first subset of the n current sources, $n_1$, to a p-n junction;

a second one of the pair of $V_{BE}$ voltages is produced by connecting a second subset of the n current sources, $n_2$, to the same or a second p-n junction; and wherein the adjustment comprises varying either or both $n_1$ and $n_2$, from nominal values for at least one of the charge samples corresponding to $\Delta V_{BE}$.

22. A charge balance circuit, comprising:

a summing node;

a plurality, n, of unit current sources, each one of such current sources producing an equal amount of current;

one, or more p-n junctions;

a switching circuit for coupling $n_1$, where $n_1$ is an integer equal to or greater than one, current sources to one of the p-n junctions, such junction producing a first $V_{BE}$ voltage in response to such coupled one of the current sources and for coupling $n_2$ (where $n_2$ is greater than $n_1$) of the current sources to such one, or another one of, the p-n junctions to produce a second $V_{BE}$ voltage;

a $\Delta V_{BE}$ sampling and charge transfer circuit for sampling the first and second $V_{BE}$ voltages and transferring charge corresponding to a difference between the first and second $V_{BE}$ voltages to the summing node; and a controller for ensuing usage of any one of the unit current sources to produce the second $V_{BE}$ voltage is $n_2/n_1$ times greater that such one of the unit current sources usage to produce the first $V_{BE}$ voltage.

23. The charge balance circuit recited in claim 22 wherein $n_1=1$ and $n_2=n-1$.

24. A charge balance circuit, comprising:

a summing node;

a plurality, n, of unit current sources, each one of such current sources producing the same amount of current;

one, or more p-n junctions;

a switching circuit for coupling one of the current sources to one of the p-n junctions, such junction producing a first $V_{BE}$ voltage in response to such coupled one of the current sources and for coupling n−1 of the current sources to such one, or another one of, the p-n junctions to produce a second $V_{BE}$ voltage;

a $\Delta V_{BE}$ sampling and charge transfer circuit for sampling the first and second $V_{BE}$ voltages and transferring charge corresponding to a difference between the first and second $V_{BE}$ voltages to the summing node; and a controller for coupling a different one of the n current sources to the p-n junctions to produce the first $V_{BE}$ voltage.

* * * * *